US010355052B2

(12) United States Patent
Lu et al.

(10) Patent No.: US 10,355,052 B2
(45) Date of Patent: Jul. 16, 2019

(54) OLED DISPLAY DEVICE

(71) Applicant: BOE TECHNOLOGY GROUP CO., LTD., Beijing (CN)

(72) Inventors: Yongchun Lu, Beijing (CN); Hongfei Cheng, Beijing (CN); Xinyin Wu, Beijing (CN); Yongda Ma, Beijing (CN); Jianbo Xian, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/748,295

(22) PCT Filed: Jun. 27, 2017

(86) PCT No.: PCT/CN2017/090381
§ 371 (c)(1),
(2) Date: Jan. 29, 2018

(87) PCT Pub. No.: WO2018/099058
PCT Pub. Date: Jun. 7, 2018

(65) Prior Publication Data
US 2019/0006427 A1 Jan. 3, 2019

(30) Foreign Application Priority Data
Dec. 1, 2016 (CN) ...................... 2016 2 1314833 U

(51) Int. Cl.
*H01L 27/32* (2006.01)
*H01L 51/52* (2006.01)
(Continued)

(52) U.S. Cl.
CPC .......... *H01L 27/32* (2013.01); *H01L 51/0508* (2013.01); *H01L 51/50* (2013.01);
(Continued)

(58) Field of Classification Search
CPC . H01L 27/32; H01L 51/0508; H01L 51/5221; H01L 51/5206; F21Y 2115/15
(Continued)

(56) References Cited

U.S. PATENT DOCUMENTS 7,423,374 B2 9/2008 Okano
8,659,021 B2 2/2014 You et al.
(Continued)

FOREIGN PATENT DOCUMENTS

CN 102544054 A 7/2012
CN 206194793 U 5/2017

OTHER PUBLICATIONS

Search Report for International Application No. PCT/CN2017/090381 dated Oct. 11, 2017.

*Primary Examiner* — Karen Kusumakar
*Assistant Examiner* — Adam S Bowen
(74) *Attorney, Agent, or Firm* — Calfee, Halter & Griswold LLP

(57) ABSTRACT

The present disclosure relates to an OLED display device, including OLED units and a pixel spacer layer having a plurality of opening portions, which are disposed on a substrate. Each OLED unit includes an anode, a light-emitting functional layer and a cathode which are disposed sequentially in a direction away from the substrate. The light-emitting functional layer is disposed in the opening portions. The pixel spacer layer is provided with a via hole. The display device further includes: an auxiliary electrode disposed below the pixel spacer layer, corresponding to a display area, spaced apart from the anode, and connected to the cathode through the via hole in the pixel spacer layer; and a print circuit board disposed at a side of the substrate (Continued)

away from the pixel spacer layer, configured to transmit a signal of the cathode to the auxiliary electrode through an conductive lead.

17 Claims, 2 Drawing Sheets

(51) Int. Cl.
    *H01L 51/05*         (2006.01)
    *H01L 51/50*         (2006.01)
    *F21Y 115/15*       (2016.01)

(52) U.S. Cl.
    CPC .......... *H01L 51/52* (2013.01); *H01L 51/5206* (2013.01); *H01L 51/5221* (2013.01); *F21Y 2115/15* (2016.08)

(58) Field of Classification Search
    USPC .......................................................... 257/40
    See application file for complete search history.

(56) References Cited

U.S. PATENT DOCUMENTS

| | | |
|---|---|---|
| 9,184,417 B2 | 11/2015 | Oh et al. |
| 2005/0253508 A1* | 11/2005 | Okano ................ H01L 27/3246 |
| | | 313/506 |
| 2012/0146030 A1 | 6/2012 | You et al. |
| 2014/0117314 A1* | 5/2014 | Jeong ................... C07K 14/245 |
| | | 257/40 |
| 2014/0131677 A1 | 5/2014 | Oh et al. |
| 2016/0276619 A1* | 9/2016 | Cheng ..................... H01L 51/56 |

\* cited by examiner (a)　　　　　(b)　　　　　(c)

OLED DISPLAY DEVICE

CROSS-REFERENCE TO RELATED APPLICATIONS

This application is based on PCT/CN2017/090381, filed on Jun. 27, 2017, which claims priority to Chinese Patent Application Serial No. 201621314833.6 filed with the State Intellectual Property Office of P. R. China on Dec. 1, 2016, the entire contents of which are incorporated herein by reference.

TECHNICAL FIELD

The present disclosure relates to the technical field of display technology, and particularly to an OLED display device.

BACKGROUND

Organic light-emitting display (OLED) device possesses advantages, such as, self-illumination, quick response, wide viewing-angle, high brightness, vivid colors and small weight over liquid crystal display (LCD) device, and hence has been considered as a next-generation technology. Self-illuminous unit such as OLED unit in the OLED display device are mainly consisted of an anode, a light-emitting functional layer and a cathode which are disposed sequentially in a direction away from a substrate. Depending on the difference in illumination direction, the OLED unit may be classified into bottom-emission type (i.e., emitting light downwardly with respect to the substrate) and top-emission type (i.e., emitting light upwardly with respect to the substrate). The top-emission mode may obtain a higher aperture ratio, and thus, existing OLED display devices mostly adopt top-emission type OLED units.

Since the cathode is usually made of pure metal and/or alloy material having low work function and is relatively poor in transmittance, in order to decrease an influence to an overall light extracting ratio of the OLED unit (especially for top-emission type OLED unit), the cathode normally has a very small thickness. Based on a square resistance expression $Rs=\rho/t$ of an electrode ($\rho$ is a resistivity of the electrode, and t is a thickness of the electrode), it can be seen that the square resistance of the cathode is increased with the decrease of the thickness thereof, accompanying with a severe voltage drop (IR drop, i.e., a potential difference between two ends of the electrode) of the OLED unit, which results in the voltage drop at a light-emitting surface of the OLED unit increasingly obvious with an increased distance from a power supply, that is, a driving transistor connected to the anode layer, thereby leading to significantly uneven illumination of the OLED unit.

As illustrated in FIG. 1, the cathode 1 of the OLED unit (including the cathode 1, the anode 2 and the light-emitting functional layer 3 located between the cathode 1 and the anode 2) is required to be connected to a print circuit board (PCB) 4. Thus it needs to dispose a via hole 6 in a non-display area (NDA) at a periphery of a display area (DA) to connect the cathode 1 to the PCB 4 through a conductive lead 5. Therefore, the via hole structure in the NDA occupies a relatively larger area of the periphery of the display screen, which significantly influences the area of the display screen of the entire OLED display device.

SUMMARY

The embodiments of the present disclosure provide an OLED display device which can mitigate the issue of voltage drop at the cathode and also decrease a peripheral dimension of the display device, especially for mini-sized OLED display device.

To achieve the above-mentioned objectives, the embodiments of the present disclosure adopt technical solutions as below.

The embodiments of the present disclosure provide an OLED display device, including OLED units and a pixel spacer layer having a plurality of opening portions, which are disposed on a substrate. The OLED unit includes an anode, a light-emitting functional layer and a cathode which are disposed sequentially in a direction away from the substrate. The light-emitting functional layer is disposed in the opening portions. The pixel spacer layer is provided with a via hole, and the display device further includes: an auxiliary electrode disposed below the pixel spacer layer to be corresponding to a display area (DA) and spaced apart from the anode, the auxiliary electrode is connected to the cathode through the via hole in the pixel spacer layer; and a print circuit board (PCB) disposed at a side of the substrate away from the pixel spacer layer, the PCB is configured to transmit a signal of the cathode to the auxiliary electrode through an conductive lead.

In an embodiment, the auxiliary electrode is disposed below the pixel spacer layer to be extending along an entire bottom side of the pixel spacer layer; and the display device further includes a dielectric isolation layer disposed in the opening portions to isolate the auxiliary electrode from the anode.

In an embodiment, the conductive lead is disposed in a non-display area (NDA) of the display device.

In an embodiment, wherein the OLED display device comprises a plurality of separated auxiliary electrodes, each one of the plurality of separated auxiliary electrodes is disposed every other four to ten OLED units.

In an embodiment, the display device further includes a planarization layer disposed in a same layer with the auxiliary electrode.

In an embodiment, a pattern of the auxiliary electrode includes at least one of strip shape, zigzag shape or grid shape.

In an embodiment, the cathode is disposed to cover an entire surface of the pixel spacer layer and is connected to the auxiliary electrode through the via hole in the pixel spacer layer.

In an embodiment, the auxiliary electrode is formed of topological insulator.

In an embodiment, the topological insulator includes at least one of Tin atom monolayer and a variation material of Tin atom monolayer.

In an embodiment, the PCB is fixed onto the substrate by a wedding method or an adhering method.

In an embodiment, the substrate includes a base substrate; an array structural layer disposed on the base substrate; a protection layer disposed below the pixel spacer layer to cover the array structural layer. The base substrate is formed of at least one material selected from the group consisted of silicon, glass, organic compound and polymer material.

In an embodiment, the auxiliary electrode includes a first conductive layer and a second conductive layer, and a material of forming the first conductive layer is the same with a material of forming the anode.

In an embodiment, a width of a portion of the auxiliary electrode overlapped with the cathode is ranged from 150 µm to 250 µm.

In an embodiment, the display device further includes a connecting hole configured to connect the anode and a thin film transistor (TFT) driving the anode, and a width or an area of at least a part of the via hole is larger than a width or an area of the connecting hole.

In an embodiment, the OLED display device is a top-emission type OLED display device.

The embodiments of the present disclosure provide a manufacturing method of OLED display device, comprising: depositing an electrode material on an entire surface of a substrate to form an auxiliary electrode; forming a pixel spacer layer with a pattern by a patterning process; forming a plurality of opening portions in the pixel spacer layer to delimit a plurality of pixel regions; sequentially forming a dielectric isolation layer, an anode and a light-emitting functional layer in each of the pixel regions by a patterning process; depositing a cathode, and connecting the cathode to the auxiliary electrode disposed there-below through the via hole in the pixel spacer layer.

In an embodiment, the auxiliary electrode is deposited every other four to ten OLED units.

The embodiments of the present disclosure provide a manufacturing method of OLED display device, comprising: depositing an insulating layer on a substrate, and forming a planarization layer by patterning the insulating layer through a patterning process and delimiting a region of auxiliary electrode; forming an auxiliary electrode in the region as delimited; forming a pixel spacer layer with a pattern by a patterning process; forming a plurality of opening portions in the pixel spacer layer to delimit a plurality of pixel regions; sequentially forming an anode and a light-emitting functional layer in each of the pixel regions by a patterning process; and depositing a cathode and connecting the cathode to the auxiliary electrode disposed there-below through the via hole in the pixel spacer layer.

The embodiments of the present disclosure provide an OLED display device, comprising a pixel spacer layer and OLED units on a substrate, the pixel spacer layer having a plurality of opening portions, wherein each OLED unit comprises an anode, a light-emitting functional layer and a cathode arranged in a direction away from the substrate; wherein the light-emitting functional layer is in the opening portions, and wherein the pixel spacer layer being provided with a via hole, the display device further comprising: an auxiliary electrode disposed below the pixel spacer layer, corresponding to a display area, and being spaced apart from the anode, the auxiliary electrode being connected to the cathode through the via hole in the pixel spacer layer.

In this way, the above-mentioned OLED display device provided by the embodiments of the present disclosure connects the cathode in the OLED unit to the auxiliary electrode disposed there-below through the via hole in the pixel spacer layer. On one aspect, since the cathode and the auxiliary are connected in parallel, a surface resistance of the cathode having a relatively smaller thickness is decreased, thereby mitigating the issue of voltage drop at the cathode in the OLED unit and avoiding significantly uneven illumination in the OLED display device; on the other aspect, since the auxiliary electrode is disposed in the DA while the via hole connecting the auxiliary electrode and the cathode is also disposed in a portion of the pixel spacer layer corresponding to the DA, the auxiliary electrode is connected to the PCB disposed at the other side of the substrate through the conductive lead disposed in the NDA so that the via hole will not occupy the area of the NDA, thereby avoiding the problem existed in the prior art that it has to provide a via hole in the NDA to occupy the area of the NDA due to the conductive lead directly extending from the cathode to the PCB, and decreasing the peripheral dimension of the display element. It's especially applicable for micro-OLED display device in which a diagonal length of the display screen is smaller than 5 cm.

BRIEF DESCRIPTION OF THE DRAWINGS

Hereinafter the drawings necessary for the description of the embodiments or the prior art will be briefly introduced for the purpose of more clearly explaining the technical solutions of the embodiments of the present disclosure or the prior art. Obviously, the drawings described as below merely illustrate some embodiments of the present disclosure and should not be construed as any limitation to the disclosure.

REFERENCE SIGNS

Figure 1:
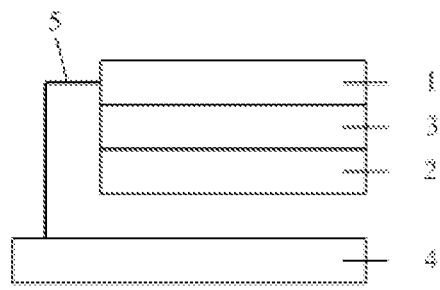
FIG. 1 is a structural schematic view of an OLED display device provided by current technology.
Figure 2:
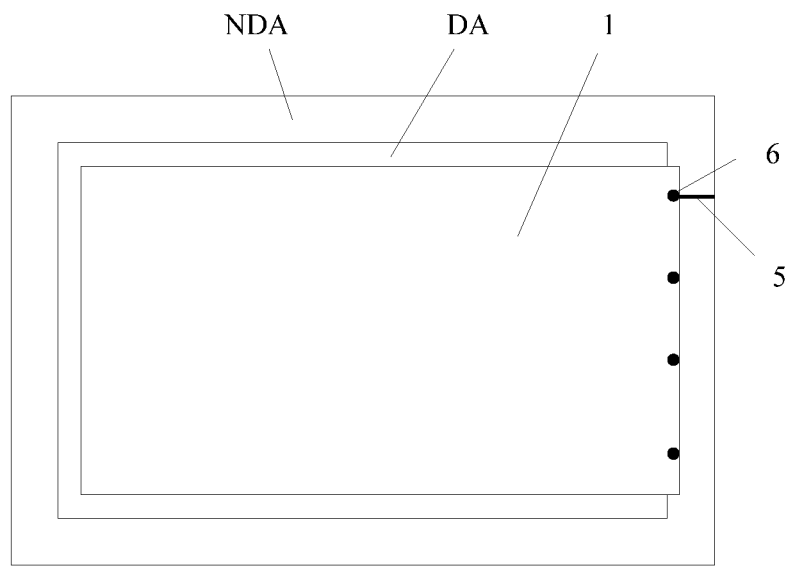
FIG. 2 is another structural schematic view of the OLED display device provided by prior art.

01-OLED display device; 10-substrate; 20-pixel spacer layer; 21-via hole; 30-OLED unit; 31-anode; 32-light-emitting functional layer; 33-cathode; 40-auxiliary electrode; 50-conductive lead; 60-PCB; 70-dielectric isolation layer; 80-planarization layer; 11-connecting hole.

DETAILED DESCRIPTION

Hereinafter, the technical solutions of the embodiments of the present disclosure will be described completely and thoroughly in conjunction with the drawings thereof. Obviously, the embodiments described herein merely illustrate part of implementations of the present disclosure rather than exhaustivity. All other possible embodiments conceivable by those skilled in the art based on those set forth herein, shall be considered as falling within the scope of protection of the present disclosure.

Unless defined oppositely, all terms (including technical terms and scientific terms) as used herein should be interpreted identically with those generally understood by one ordinary skilled in the art. It should also be appreciated that, the terms as defined in, for example, a publically used dictionary, should be interpreted to have meanings consistent with that in the context of related fields, and shall not be interpreted ideally or excessively literally, unless definitely specified so in the present disclosure.

For example, as used in the description and the claims of the present disclosure, a wording such as "comprises" and "includes" is intended to specify that, an element or an object preceding the wording covers element(s) or object(s) and the like which are listed following the wording, without excluding the presence of other element(s) or object(s). Terms such as "above" and "below" merely specify orientations or positional relationships with respect to the drawings for purpose of simplifying the explanation of the technical solutions of the present disclosure only, rather than indicating or implying that the involved device or element necessarily possesses specific orientation or is necessarily structured with specific orientations and operations, and hence shall not be interpreted as constituting any limitation to the present disclosure.

Moreover, considering that actual dimensions of OLED units involved in the embodiments of the present disclosure are extremely small, for the sake of clarity, the sizes of various structures in the drawings of the embodiments of the present disclosure are all exaggerated and do not indicate their actual scales.

Figure 3:
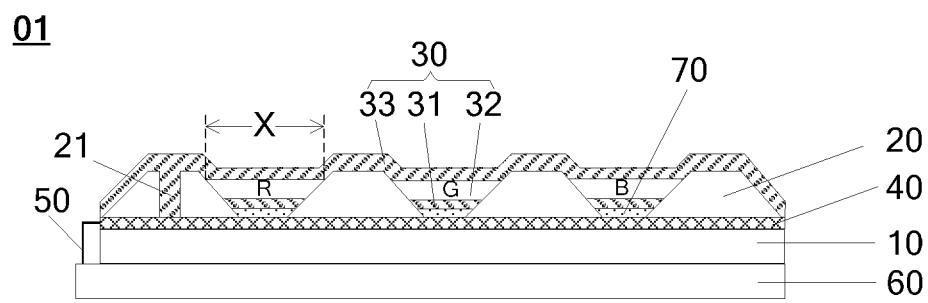
FIG. 3 is a structural schematic view of an OLED display device provided by an embodiment of the present disclosure.
Figure 4:
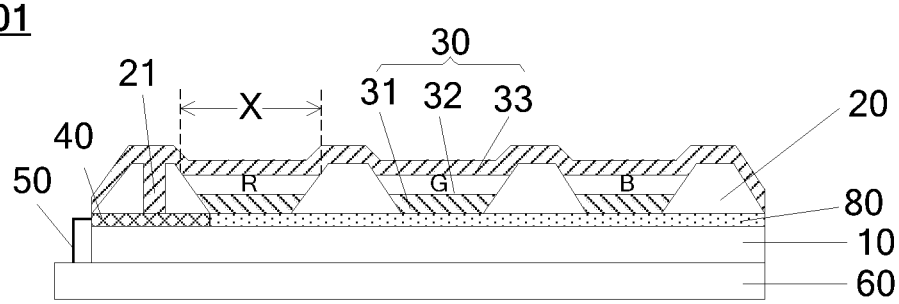
FIG. 4A and FIG. 4B are another structural schematic views of the OLED display device provided by an embodiment of the present disclosure.

As illustrated in FIG. 3 and FIGS. 4A and 4B, an embodiment of the present disclosure provides an OLED display device 01. The display device 01 includes OLED units 30 and a pixel spacer layer 20 having a plurality of opening portions, which are disposed on a substrate 10; the OLED unit 30 includes an anode 31, a light-emitting functional layer 32 (in the drawings, regions corresponding to different pixels are denoted as R, G and B, respectively) and a cathode 33 which are disposed sequentially in a direction away from the substrate 10; the light-emitting functional layer 32 is disposed in the opening portions. The pixel spacer layer 20 is provided with a via hole 21, and the above-mentioned display device 01 further includes: an auxiliary electrode 40 disposed below the pixel spacer layer 20 to be corresponding to a display area (DA) and spaced apart from the anode 31, the auxiliary electrode 40 is connected to the cathode 33 through the via hole 21 in the pixel spacer layer 20; a conductive lead 50 disposed in a non-display are (NDA); and a print circuit board (PCB) 60 disposed at one side of the substrate 10 away from the pixel spacer layer 20, the PCB 60 is configured to transmit a signal of the cathode to the auxiliary electrode 40 through the conductive lead 50. It should be explained that, the plurality of opening portions in the pixel spacer layer 20 are configured to delimit a plurality of pixel regions which are denoted as X in the above-mentioned figures.

By way of example, along a direction pointing from the anode 31 to the cathode 33, the light-emitting functional layer 32 of the OLED unit 30 may further include a hole injection layer, an electron barrier layer, a light-emitting layer, a hole barrier layer, an electron injection layer and other structures. These layers may be formed of small organic molecular material and organic polymer material; or may adopt inorganic material and compound doped material. Of course, the light-emitting functional layer 32 may include a monochromatic light-emitting layer such as blue light-emitting layer; or, the light-emitting functional layer 32 may include a monochromatic light-emitting layer and a color conversion layer, for example, the monochromatic light-emitting layer is a blue light-emitting layer, and the color conversion layer includes red, green and blue color conversion layer; or, the light-emitting functional layer 32 includes light-emitting layers of multiple colors, for example, red, green, blue and white light-emitting layer.

For example, since the cathodes of the OLED units 30 are usually connected to a same power supply voltage U1 (e.g., 0V), in order to simplify the structure of the OLED display device, the cathodes are connected together to form an integral/common cathode.

FIGS. 3, 4A and 4B of the present embodiment of the present disclosure are merely described with reference to the case where all the cathodes are connected together to form an integral cathode by way of example. The integral cathode may cover the pixel spacer layer 20, and may be connected to the auxiliary electrode 40 through at least one via hole 21 in the pixel spacer layer 20. However, the present disclosure is not limited thereto.

Of course, the embodiments of the present disclosure are not limited to that, and the cathodes of the OLED units 30 may be disposed separately, and may be connected to the auxiliary electrode 40 through the plurality of via holes 21 in the pixel spacer layer 20, respectively.

For example, the PCB 60 may be fixed onto the substrate by a welding method or an adhering method, without particularly defined in the embodiments of the present disclosure.

For example, the above-mentioned display device may be any product or component having displaying function, such as OLED panel, OLED displayer, micro-OLED displayer, OLED TV, digital photo frame, mobile phone and tablet computer.

In this way, the above-mentioned OLED display device 01 provided by the embodiments of the present disclosure connects the cathode 33 in the OLED unit 30 to the auxiliary electrode 40 disposed there-below through the via hole 21 in the pixel spacer layer 20. On one hand, since the cathode 33 and the auxiliary electrode 40 are connected in parallel, a surface resistance of the cathode having a relatively smaller thickness is decreased, thereby mitigating the issue of voltage drop at the cathode of the OLED unit and avoiding significantly uneven illumination in the OLED display device. On the other hand, since the auxiliary electrode 40 is disposed in the DA while the via hole 21 connecting the auxiliary electrode 40 and the cathode 33 is also disposed in a portion of the pixel spacer layer 20 corresponding to the DA, the auxiliary electrode 40 is connected to the PCB 60 disposed at the other side of the substrate 10 through the conductive lead 50 disposed in the NDA so that the via hole will not occupy the area of the NDA, thereby avoiding the problem existed in the prior art that it has to provide a via hole in the NDA to occupy the area of the NDA due to the conductive lead directly extending from the cathode to the PCB, and decreasing the peripheral dimension of the display element.

The inventors noticed that, the technology of the present disclosure is especially applicable for micro-OLED display device. Since a diagonal length of the display screen in the micro-OLED display device usually is smaller than 5 cm, the via hole in the NDA will significantly occupy the periphery area of the display screen of the entire micro-OLED display device; therefore, the via hole structure in this NDA facilitates saving a layout space of the micro-OLED display device.

Further, the above-mentioned substrate 10 particularly includes: a base substrate formed of at least one material selected from the group consisted of silicon, glass, organic compound and polymer material; an array structural layer disposed on the base substrate; and a protection layer covering the array structural layer. For example, the array structural layer is a structure formed by a plurality of thin film transistors (TFTs) arranged in array, and the anode 31 of the OLED unit 30 is connected to its corresponding TFT through a connecting hole 11 in the protection layer, as shown in FIG. 4B. In other words, each of the pixel regions is independently controlled by TFT addressing. In this way, each of the pixels may be selectively controlled so as to facilitate achieving OLED colorization. The specific structure of the array structural layer may refer to the prior art, without particularly defined in the embodiments of the present disclosure. The TFT may be of N type, P type or CMOS type. Of course, an active layer of the TFT may be of amorphous type, Oxide type, LTPS type, OTPS type (a combination of Oxide and LTPS) and the like.

In an embodiment, the above-mentioned substrate 10 may be a base substrate including a driving chip, and the driving chip includes a driving element connected to a corresponding OLED unit. For example, the above-mentioned displayer may be applied in micro-OLED display device, and the substrate 10 includes an active silicon layer which incorporates an E-pixel addressing circuit manufactured as an integrated circuit. Generally, the active silicon layer is formed on a circular-shaped substrate wafer which is formed from silicon, glass, quartz or sapphire.

Further, the above-mentioned auxiliary electrode 40 may be formed of at least one material selected from the group consisted of conventional Cu, Ag, Au, Pt, Al, Ni and Mo having low resistance.

Alternatively, the auxiliary electrode 40 may be formed of topological insulator. A topological insulator is an extremely special insulator. Such material has an energy gap at the Fermi energy level, which is exactly the same as the energy band structure of typical insulators. However, a Dirac conductive marginal state without any energy gap is always existed at a surface of such material. Such conductive marginal state exists stably on the premise of ensuring a certain symmetry property (e.g., time-reversal symmetry), and different self-spinning conductive electrons are moving in opposite directions so that information may be transmitted by the self-spin of the electrons rather than by electric charge like conventional materials.

The topological insulator may include at least one of Tin atom monolayer and a variant material of Tin atom monolayer, of which the entire surface may have a conductivity reaching 100% under normal temperature (for computer chips). Furthermore, since the topology insulator exhibits an internally insulated and externally conductive property so that electrons can only move along the surface of the material but cannot be transferred through electric charges like conventional conductive materials, which involves no dissipation process, that is, the material doesn't generate heat. As a result, when applied in the above-mentioned display device, such material may reduce the heat generated during the operation of the OLED unit and hence decrease the energy consumption thereof.

Further to the above, referring to FIG. 3, the auxiliary electrode 40 may be disposed below the pixel spacer layer 20 and may be an integral electrode extending along the entire bottom surface of the pixel spacer layer 20 so as to simplify the manufacturing process.

Herein, since at least part of the area of the anode 31 is disposed at the opening portions of the pixel spacer layer 20 so as to form the light-emitting functional layer 31 on the anode 31 by an evaporation process, in order to prevent the auxiliary electrode 40 from contacting with the anode 31 to cause a short circuit between the cathode 33 and the anode 31, as illustrated in FIG. 3, the above-mentioned display device 01 further includes a dielectric isolation layer 70 which is disposed in the opening portions of the pixel spacer layer 20 and configured to isolate the auxiliary electrode from the anode 31.

In an embodiment, on the premise of ensuring the anode 31 isolated from the auxiliary electrode 40, the auxiliary electrode 40 may be disposed in a same layer with the anode 31 so as to simplify the process. Or, alternatively, the auxiliary electrode 40 includes a second conductive layer and a patterned first conductive layer which is located in a same layer with the anode, and the first conductive layer is located between the cathode and the second conductive layer so as to avoid an excessively deep via hole which is used for connecting the cathode 31 and the auxiliary electrode 40 in the pixel spacer layer 20 and to ensure the yield rate. The first conductive layer may be formed with the same material as the anode; and the second conductive layer may be formed of at least one material selected from the group consisted of Cu, Ag, Au, Pt, Al, Ni and Mo. In an embodiment, the cathode 33 is spaced apart from an edge of the substrate 10 by a distance of about 500 μm-600 μm.

In an embodiment, the auxiliary electrode 40 is spaced apart from the edge of the substrate 10 by a distance of 0 μm-350 μm.

In an embodiment, a portion of the auxiliary electrode 40 overlapped with the cathode 33 has a width W (FIG. 4B) of about 150 μm-250 μm; and in an embodiment, the portion of the auxiliary electrode 40 overlapped with the cathode 33 has an area which is 10%-90% of an area of the auxiliary electrode 40.

In an embodiment, an orthographic projection of at least the auxiliary electrode 40 is overlapped with orthographic projections of anodes 31 in part of or all of the pixel regions on the substrate 10.

In an embodiment, in order to save the layout space and also satisfy requirements of the masking process for the via hole, the via hole 21 configured to connect the cathode 33 and the auxiliary 40 is spaced apart from the OLED unit by a distance which satisfies a certain condition, for example, at least part of the via hole 21 is spaced apart from the anode 31 in the pixel region by a distance of about 15 μm-200 μm.

In an embodiment, at least a part of the via hole 21 is located between adjacent pixel regions having different colors. For example, a part of the via hole 21 is located between R pixel region and G pixel region which are adjacent to each other.

In an embodiment, it further includes a connecting hole 11 (as shown in FIG. 4B) between the anode 31 and the TFT driving the anode 31, and at least a part of the via hole 21 is located in a same extending line with the connecting hole 11 so as to facilitate the design of the masking process.

In an embodiment, as shown in FIG. 4B, it further includes a connecting hole 11 between the anode 31 and a TFT driving the anode 31, and a width (or an area) of at least a part of the via hole 21 is larger than a width Y (or an area) of the connecting hole 11 so as to guarantee a connecting strength of the cathode and the auxiliary electrode. For example, a width of a part of the via hole 21 is 1.2-5 times of a width Y of the connecting hole between the anode 31 and the TFT driving the anode 31, and an area of a part of the via hole 21 is 1.2-5 times of an area of the connecting hole 11 between the anode 31 and the TFT driving the anode 31.

In an embodiment, the OLED display device provided by the present disclosure is a top-emission type OLED display device.

In an embodiment, the OLED display device provided by the present disclosure is a micro-OLED display device.

The manufacturing process may include steps as below.

Step 1.1, depositing an electrode material on an entire surface of a substrate 10 to form an auxiliary electrode 40.

Step 1.2, forming a pixel spacer layer 20 with a certain pattern by a patterning process; forming a plurality of opening portions in the pixel spacer layer 20 to delimit a plurality of pixel regions X.

Step 1.3, sequentially forming a dielectric isolation layer 70, an anode 31 and a light-emitting functional layer 32 in each of the pixel regions X by a patterning process.

Herein, a via hole 21 may be formed in the pixel spacer layer 20 by a masking process in which an exposure level is adjustable so that the via hole may be fabricated in a same process along with the anode 31, without the need of adding other process flows.

Step 1.4, depositing a cathode 33, and connecting the cathode 33 to the auxiliary electrode 40 disposed therebelow through the via hole 21 in the pixel spacer layer 20.

Figure 5:
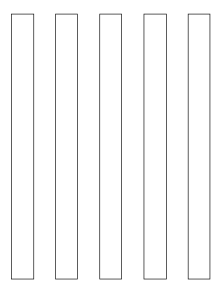
FIGS. 5A-5C illustrates a pattern of an auxiliary electrode in FIGS. 4A and 4B.
Figure 5:
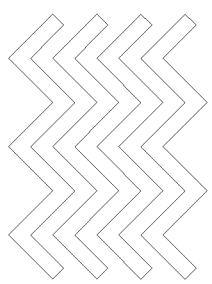
Figure 5:
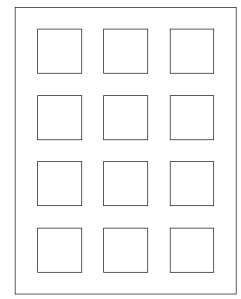

Alternatively, referring to FIGS. 4A and 4B, it's also possible to dispose the auxiliary electrode 40 every other four to ten OLED units 30; that is to say, the above-mentioned display device 01 includes a plurality of auxiliary electrodes 40 which are disposed alternately. As an example, FIG. 4B shows that one auxiliary electrode 40 is disposed every other four OLED units 30. The pattern of the auxiliary electrode 40 is not particularly defined in the embodiments of the present disclosure, for example, it may be in a strip shape as illustrated in FIG. 5A, or may be in a zigzag shape as illustrated in FIG. 5B, or may be in a grid shape as illustrated in FIG. 5C.

Herein, since the plurality of auxiliary electrodes 40 disposed alternately are located below the pixel spacer layer 20, in order to ensure the pixel spacer layer 20 has a good flatness so as to avoid layout defects resulted by steps in different regions of the pixel spacer layer 20 during forming respective layers of the OLED unit, as illustrated in FIG. 4A, the above-mentioned display device 01 further includes a planarization layer 80 disposed in a same layer with the auxiliary electrode 40, and a thickness of the planarization layer 80 is the same with a thickness of the auxiliary electrode 40 so as to provide the entire pixel spacer layer 20 with good flatness.

The above-mentioned " . . . disposed in a same layer with . . . " refers to a structure in which at least two patterns are disposed on a same thin film.

The manufacturing process may include steps as below.

Step 2.1, depositing an insulating layer on a substrate 10, forming a planarization layer 80 by patterning the insulating layer through a patterning process and delimiting a region of auxiliary electrode.

Step 2.2, forming an auxiliary electrode 40 in the region as delimited.

Step 2.3, forming a pixel spacer layer 20 with a certain pattern by a patterning process; forming a plurality of opening portions in the pixel spacer layer 20 to delimit a plurality of pixel regions X.

Step 2.4, sequentially forming an anode 31 and a light-emitting functional layer 32 in each of the pixel regions X by a patterning process.

Herein, a via hole 21 may be formed in the pixel spacer layer 20 by a masking process in which an exposure level is adjustable so that the via hole may be fabricated in a same process along with the anode 31 without the need of adding other process flows.

Step 2.5, depositing a cathode 33 and connecting the cathode 33 to the auxiliary electrode 40 disposed therebelow through the via hole 21 in the pixel spacer layer 20.

The foregoing are merely illustrative embodiments of the present disclosure without limiting the present disclosure thereto. Those skilled in the art would obviously conceive of various modifications and alternatives without departing from the scope and sprint of the present disclosure, which modifications and alternatives shall also be fallen within the scope of protection of the present disclosure. Therefore the scope of protection of the present disclosure should be defined by the appended claims.

What is claimed is:

1. An OLED display device, comprising a pixel spacer layer and OLED units on a substrate, the pixel spacer layer having a plurality of opening portions, wherein each OLED unit comprises an anode, a light-emitting functional layer and a cathode arranged sequentially in a direction away from the substrate; wherein the light-emitting functional layer is in the opening portions, and wherein the pixel spacer layer is provided with a via hole, the display device further comprising:

an auxiliary electrode disposed below the pixel spacer layer, corresponding to a display area, and spaced apart from and below the anode, the auxiliary electrode being connected to the cathode through the via hole in the pixel spacer layer; and a print circuit board (PCB) disposed at a side of the substrate away from the pixel spacer layer, and configured to transmit a signal of the cathode to the auxiliary electrode through a conductive lead.

2. The OLED display device according to claim 1, wherein the auxiliary electrode is an integral auxiliary electrode that is disposed below the pixel spacer layer and extends along an entire bottom side of the pixel spacer layer; and the display device further comprises a dielectric isolation layer disposed in the opening portions for isolating the auxiliary electrode from the anode.

3. The OLED display device according to claim 1, wherein the conductive lead is disposed in a non-display area of the display device.

4. The OLED display device according to claim 1, wherein the OLED display device comprises a plurality of separated auxiliary electrodes, each one of the plurality of separated auxiliary electrodes is disposed every four to ten OLED units.

5. The OLED display device according to claim 4, further comprising a planarization layer disposed in a same layer with the auxiliary electrode.

6. The OLED display device according to claim 1, further comprising a planarization layer disposed in a same layer with the auxiliary electrode.

7. The OLED display device according to claim 1, wherein a pattern of the auxiliary electrode comprises at least one of strip shape, zigzag shape or grid shape.

8. The OLED display device according to claim 1, wherein the cathode is an integral cathode covering the pixel spacer layer, wherein the integral cathode is connected to the auxiliary electrode through the via hole in the pixel spacer layer.

9. The OLED display device according to claim 8, wherein a topological insulator comprises at least one of Tin atom monolayer and a variation material of Tin atom monolayer.

10. The OLED display device according to claim 1, wherein the auxiliary electrode is formed of topological insulator.

11. The OLED display device according to claim 1, wherein the substrate comprises a base substrate; an array structural layer disposed on the base substrate; and a protection layer disposed below the pixel spacer layer and covering the array structural layer, wherein the base substrate comprises at least one material selected from the group consisted of silicon, glass, organic compound and polymer material.

12. The OLED display device according to claim 11, further comprising a connecting hole configured to connect the anode and a thin film transistor (TFT) driving the anode, and a width or an area of at least a part of the via hole is larger than a width or an area of the connecting hole.

13. The OLED display device according to claim 1, wherein the auxiliary electrode comprises a first conductive layer and a second conductive layer, and the first conductive layer is formed with the same material of the anode.

14. The OLED display device according to claim 1, wherein a width of a portion of the auxiliary electrode overlapped with the cathode is ranged from 150 µm to 250 µm.

15. The OLED display device according to claim 1, further comprising a connecting hole configured to connect the anode and a thin film transistor (TFT) driving the anode, and a width or an area of at least a part of the via hole is larger than a width or an area of the connecting hole.

16. The OLED display device according to claim 1, wherein the OLED display device is a top-emission type OLED display device.

17. An OLED display device, comprising a pixel spacer layer and OLED units on a substrate, the pixel spacer layer having a plurality of opening portions, wherein each OLED unit comprises an anode, a light-emitting functional layer and a cathode arranged in a direction away from the substrate; wherein the light-emitting functional layer is in the opening portions, and wherein the pixel spacer layer is provided with a via hole, the display device further comprising:
    an auxiliary electrode disposed below the pixel spacer layer, corresponding to a display area, and spaced apart from and below the anode, the auxiliary electrode being connected to the cathode through the via hole in the pixel spacer layer.

* * * * *